(12) United States Patent
Ishihara (10) Patent No.: US 7,346,123 B2
(45) Date of Patent: Mar. 18, 2008

(54) QUADRATURE MODULATOR

(75) Inventor: Hisaya Ishihara, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 701 days.

(21) Appl. No.: 09/775,927

(22) Filed: Feb. 2, 2001

(65) Prior Publication Data
US 2001/0016017 A1   Aug. 23, 2001

(30) Foreign Application Priority Data
Feb. 2, 2000   (JP) .............................. 2000-025150

(51) Int. Cl.
*H04L 27/36* (2006.01)
(52) U.S. Cl. ...................... 375/298; 332/103
(58) Field of Classification Search ................ 375/278, 375/298, 326; 455/86, 104, 119, 120; 332/139, 332/141
See application file for complete search history.

(56) References Cited

U.S. PATENT DOCUMENTS

| | | | | |
|---|---|---|---|---|
| 3,644,827 A | * | 2/1972 | Landefeld ................ | 324/76.43 |
| 4,638,180 A | * | 1/1987 | Sagawa et al. ............. | 327/118 |
| 5,434,887 A | * | 7/1995 | Osaka ........................ | 375/295 |
| 5,535,247 A | * | 7/1996 | Gailus et al. ............... | 375/297 |
| 5,717,719 A | * | 2/1998 | Park et al. .................. | 375/298 |
| 6,011,962 A | * | 1/2000 | Lindenmeier et al. ... | 455/226.1 |
| 6,320,912 B1 | * | 11/2001 | Baba ......................... | 375/264 |

FOREIGN PATENT DOCUMENTS

JP   10-4437   1/1998

* cited by examiner

*Primary Examiner*—Kevin Kim
(74) *Attorney, Agent, or Firm*—Katten Muchin Rosenman LLP (57) ABSTRACT

A quadrature modulator includes a local oscillator oscillating at an oscillation frequency equal to $4/(2N+1)$ times a carrier frequency where N is a natural number, a frequency conversion block for multiplying the oscillation frequency by a factor of $(2N+1)/2$, a divider for dividing the multiplied oscillation frequency to output a pair of orthogonal carrier waves, first and second multipliers for modulating the carrier waves with a digital baseband signal, and an adder for adding the modulated carrier waves to output a carrier signal having the carrier frequency. The frequency conversion block includes a divider for dividing the oscillation frequency, N frequency mixers cascaded from one another and a band-pass-filter, which are cascaded in this order.

12 Claims, 10 Drawing Sheets

FIG. 9

QUADRATURE MODULATOR

BACKGROUND OF THE INVENTION (a) Field of the Invention

The present invention relates to a quadrature modulator and, more particularly to a quadrature modulator which performs modulation of quadrature (orthogonal) carrier waves with a digital baseband signal to deliver an output digital carrier signal. The present invention also relates to a method for quadrature-modulating carrier waves with a digital baseband signal.

(b) Description of the Related Art

In a wireless transmitter block of a digital cellular phone, for example, orthogonal carrier waves each having a frequency equal to the frequency of the output digital carrier signal are quadrature-modulated with a digital baseband signal which includes information to be transmitted. The modulated carrier waves are then added together to generate the output digital carrier signal, and transmitted through a transmission antenna. This scheme of quadrature modulation is suitable for simplification of the communication system and for reduction of noise in the transmitted carrier signal.

Figure 1:
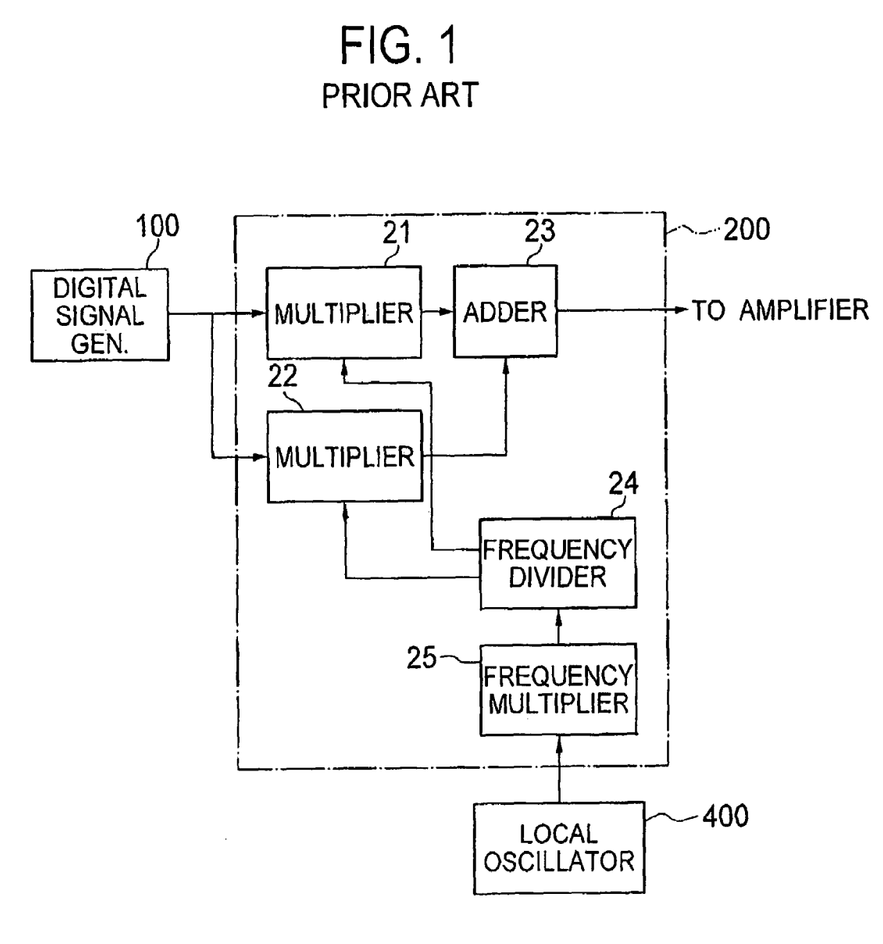
FIG. 1 is a block diagram of a conventional quadrature modulator.

FIG. 1 shows a fundamental structure of a conventional quadrature modulator, wherein the output frequency from a local oscillator 400 is exactly equal to the frequency of the output digital carrier signal delivered from the modulation block 200. This causes affection of the local oscillator 400 by the output carrier signal fed back through the transmission antenna to degrade the modulation accuracy. Thus, a metallic shield is generally provided for encircling the quadrature modulator as a whole.

Figure 2:
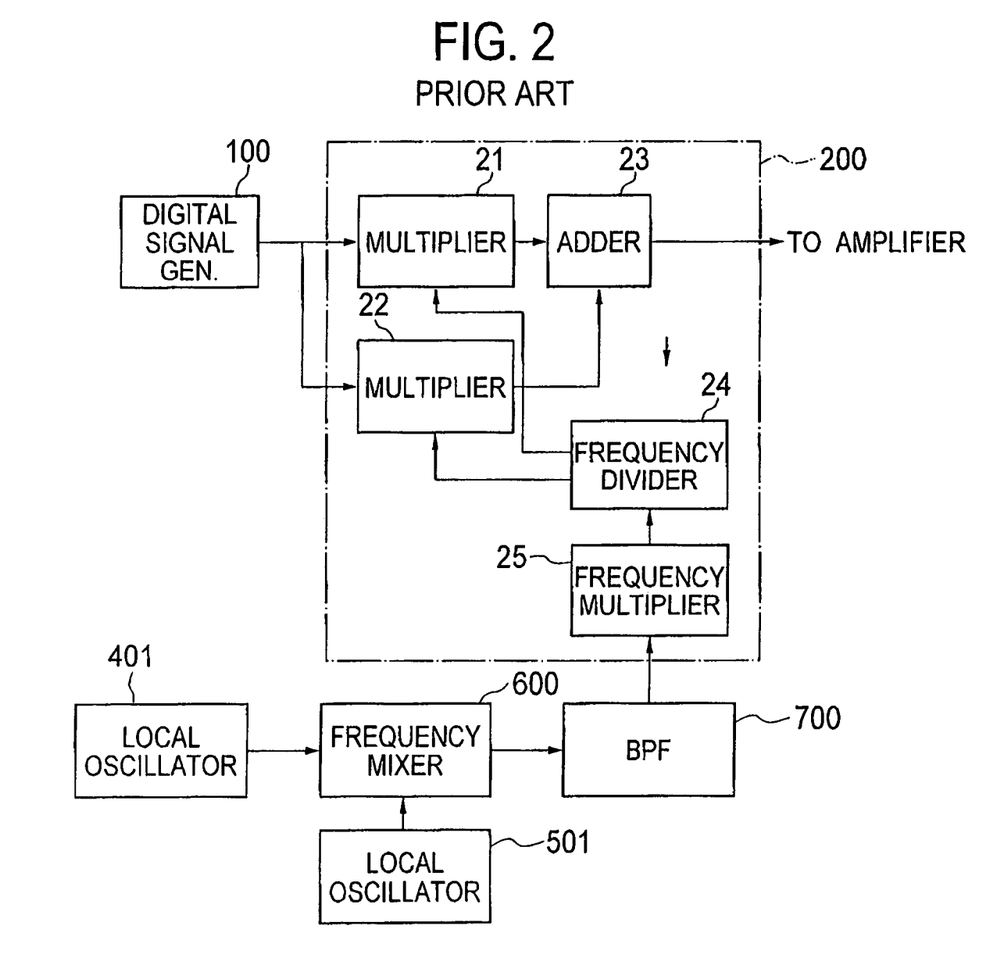
FIG. 2 is a block diagram of another conventional quadrature modulator.

FIG. 2 shows another quadrature modulator, wherein the above problem is solved by the difference between the oscillation frequencies of a pair of local oscillators 401 and 501 and the frequency of the output carrier signal. However, since the frequency mixer 600 has a non-linearity, a plurality of harmonics (harmonic signals) of the oscillation frequencies of the local oscillators 401 and 501 are generated during the frequency conversion by the frequency mixer 600. The harmonics, also subjected to frequency conversion, generate spurious signals in the vicinity of the output carrier signal.

As a practical example of the frequencies used in mobile stations of personal digital cellular (PDC) system prescribed in the standards of cellular phones in Japan, the output frequencies of the local oscillators 401 and 501 are 135 and 795 MHz, respectively. In this case, the frequency of the output digital carrier signal is 930 MHz. The frequencies of spurious signals occurring in the most vicinity of the frequency 930 MHz of the output carrier signal are 945 MHz and 915 MHz. The frequency 945 MHz is seventh-order harmonic of 135 MHz, and the frequency 915 MHz is a frequency difference between the second-order harmonic of 795 MHz and the fifth-order harmonic of 135 MHz.

These spurious signals occur within or in the vicinity of the band of the output digital carrier signal, and are difficult to remove by using filters, acting as interference waves against the adjacent transmission channels or other communication systems.

Figure 3:
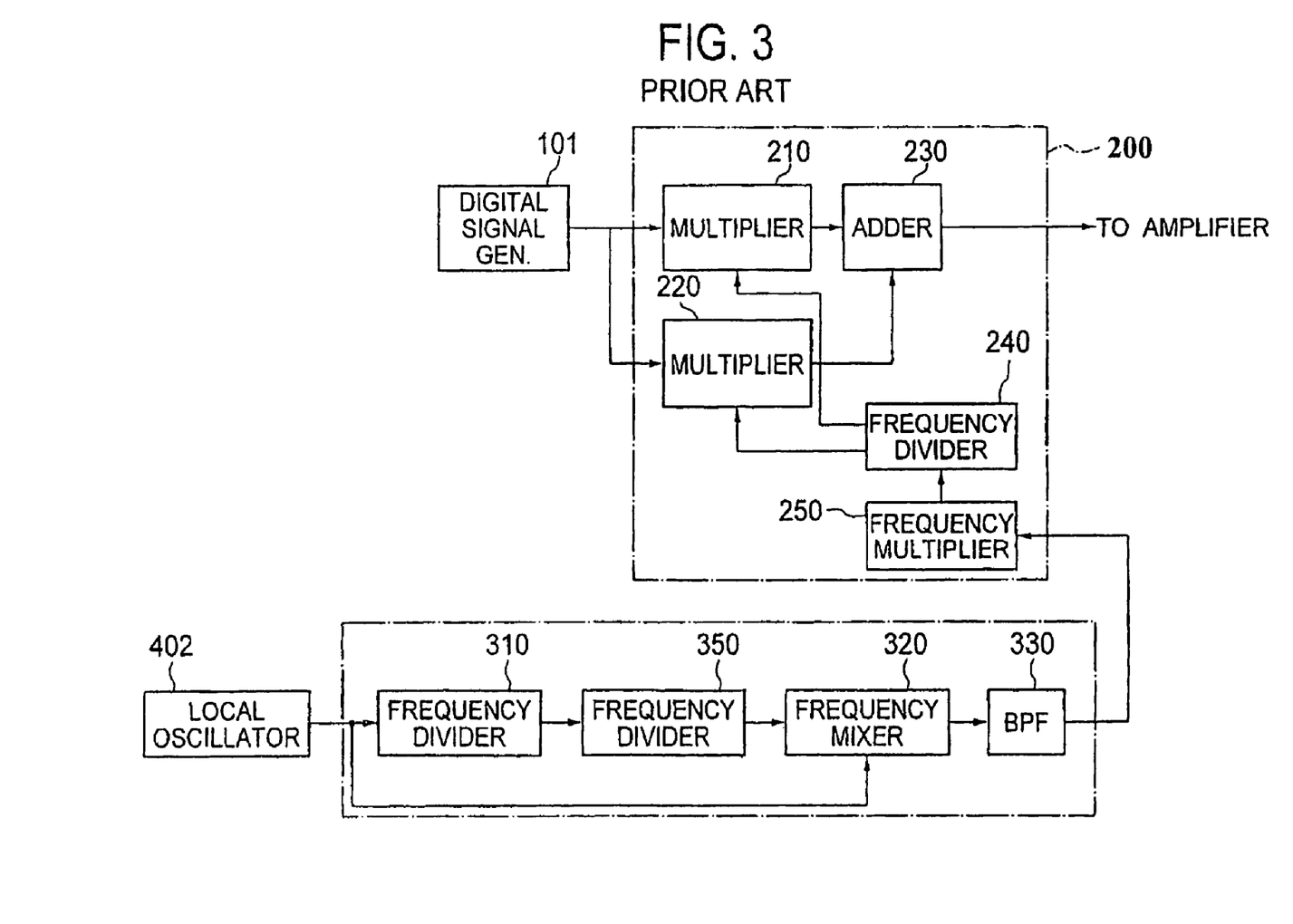
FIG. 3 is a block diagram of another conventional quadrature modulator.

FIG. 3 shows another quadrature modulator described in Patent Publication JP-A-10-4437, which solves the above problem in the quadrature modulator of FIG. 2. The quadrature modulator of FIG. 3 includes a local oscillator 402 for oscillating at a specified frequency, a first ½-frequency-divider 310 for dividing the output frequency of the local oscillator 402 by a factor of two, a second ½-frequency-divider 350 cascaded from the first ½-frequency-divider 310 for dividing the output frequency thereof by a factor of two, a frequency mixer 320 for frequency conversion using the output frequencies of second ½-frequency-divider 350 and the local oscillator 402, a band-pass-filter (BPF) 330 for removing the image signal from the output of the frequency mixer 320, a frequency-multiplier (doubler) 250 for doubling the output of the BPF 330, a third ½-frequency-divider 240 for dividing and phase-shifting the output from the frequency multiplier 250 to output a pair of orthogonal carrier waves having a phase difference of 90 degrees therebetween, first and second multipliers 210 and 220 for modulating the carrier waves with a baseband signal generated by a digital signal generator 101, and an adder 230 for adding the outputs of the first and second multipliers 210 and 220 to generate an output digital carrier signal.

In operation, the first frequency divider 310 divides the output oscillation frequency from the local oscillator 402 by a factor of two, and the second frequency divider 350 divides the output of the first frequency divider 310 by a factor of two to deliver its output to the frequency mixer 320. The frequency mixer 320 acts for frequency conversion by using the output frequencies from the local oscillator 402 and the second frequency divider 350.

Figure 4:
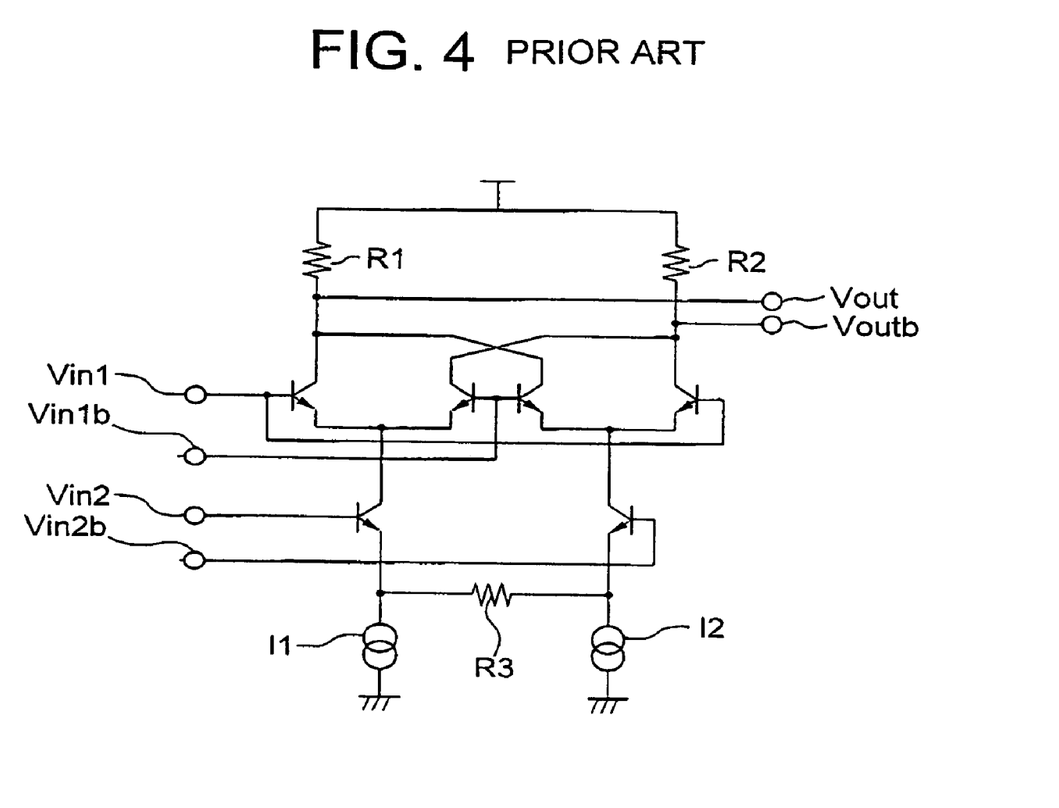
FIG. 4 is a circuit diagram of the frequency doubler shown in FIG. 3 and implemented by a double-balanced mixer.

FIG. 4 shows an example of the frequency mixer, which is implemented by a so-called double-balanced mixer. The input signals are supplied to both the input terminals $V_{in1}$ and $V_{in2}$, whereas the input terminals $V_{in1b}$ and $V_{in2b}$ are grounded through a capacitor, or may be applied with the inverted input signals.

Assuming that the outputs from the local oscillator 402 and the second frequency divider 350 are expressed by $V_H \sin\omega_{osc} t$ and $V_L \sin\omega_{osc} t/4$, respectively, the output LO(t) of the frequency mixer 320 is expressed as follows:

$$LO(t) = V_H \sin\omega_{osc} t \times V_L \sin(\omega_{osc} t/4)$$
$$= -(1/2) \cdot V_L V_H \cos(\omega_{osc} + \omega_{osc}/4)t +$$
$$(1/2) \cdot V_L V_H \cos(\omega_{osc} - \omega_{osc}/4)t$$
$$= -(1/2) \cdot V_L V_H \cos(5\omega_{osc} t/4) +$$
$$(1/2) \cdot V_L V_H \cos(3\omega_{osc} t/4),$$

wherein the gain of the double-balanced mixer is assumed at "1" for purpose of simplification.

That is, a pair of angular frequency components $5\omega_{osc}/4$ and $3\omega_{osc}/4$ are generated therein.

Assuming that the output digital carrier signal has a frequency of 930 MHz, as in the case of the quadrature modulator of FIG. 2, the local oscillator 402 delivers an output frequency of 1240 MHz to the first frequency divider 310. The first frequency divider 310 delivers an output frequency of 620 MHz to the second frequency divider 350, which delivers an output frequency of 310 MHz. The frequency mixer 320 delivers a signal having frequency components of 930 MHz and 1550 MHz based on the output frequency of 1240 MHz from the local oscillator 402 and the output frequency of 310 MHz from the second frequency divider 350. In this case, the difference between the frequency ($3\omega_{osc}/4$: 930 MHz) of the carrier wave and the frequency ($5\omega_{osc}/4$: 1550 MHz) of the image signal is 620 MHz.

Figure 5:
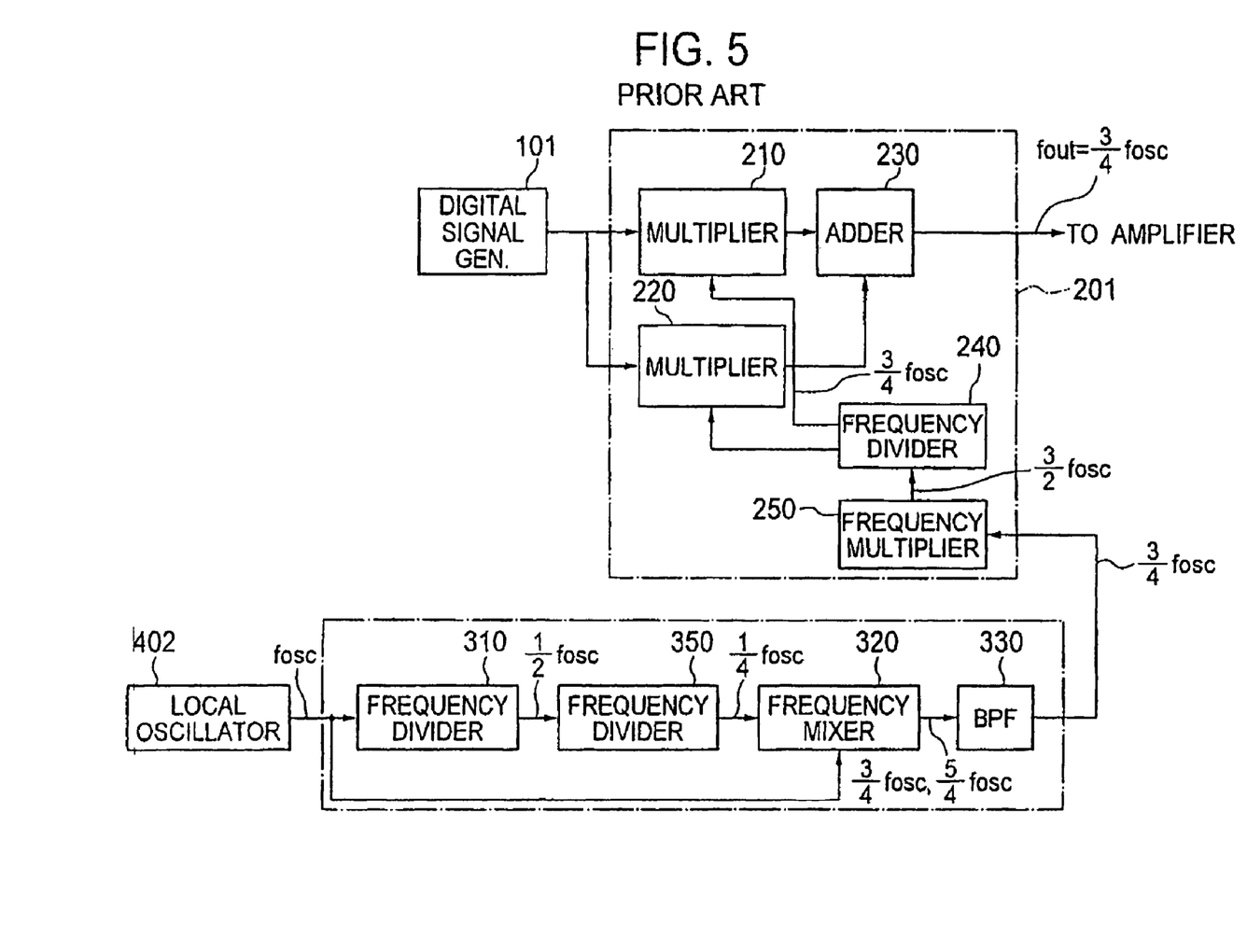
FIG. 5 is a block diagram for illustrating the frequency of the output of each component shown in FIG. 3.

The BPF 330 removes the image signal having the frequency component of 1550 MHz, passes the carrier frequency component of 930 MHz. The frequency doubler 250 then doubles the output from the BPF 330 to deliver an output frequency of 1860 MHz. The third frequency divider 240 then divides and shifts in phase the output from the frequency doubler 250 to deliver a pair of carrier waves having a frequency of 930 and a phase difference of 90 degrees therebetween. The first and second multipliers 210 and 220 modulates the carrier waves with the digital baseband signal output from the digital signal generator 101 to output modulated signals, which are added in the adder 230 to be delivered as an output digital carrier signal. The frequency of each block in the quadrature modulator of FIG. 3 is shown in FIG. 5 in terms of the output frequency $f_{osc}$ of the local oscillator 402.

In the quadrature modulator of FIG. 3, the output digital carrier signal has a frequency of $3f_{osc}/4$ which is different from the output frequency $f_{osc}$ of the local oscillator. This prevents degradation of the modulation accuracy, which is encountered due to the affection by the feed-back of the output carrier signal through the transmission antenna in the quadrature modulator of FIG. 2.

Spurious signals may be generated in the frequency mixer 320 as harmonics of the signal having a ¼-divided frequency of the output frequency of the local oscillator 402 due to the non-linearity of the frequency mixer 320. However, these spurious signals do not act as interference waves against the output carrier signal because the spurious signal among these spurious signals which has a frequency in the vicinity of the carrier frequency has a frequency equal to the carrier frequency itself.

The quadrature modulator of FIG. 3, however, has the drawback of a complicated structure including a large number of constituent elements therein. For example, the frequency doubler 250 is provided for the third ½-frequency-divider 240 which delivers a pair of orthogonal carrier waves while dividing the input thereof by a factor of two, The frequency doubler 250 implemented by the double-balanced mixer shown in FIG. 4 receives the output from the BPF 330 through two input terminals $V_{in1}$ and $V_{in2}$. For the double-balanced mixer receiving the same frequency signal through the two inputs, a d.c.-blocking capacitor should be provided for suppression of a d.c. offset voltage which occurs based on the phase difference between the two input terminals. In addition, as shown in FIG. 3, there are three ½-frequency-dividers. The complicated structure increases the dimensions of the IC pellet.

The quadrature modulator of FIG. 3 has another drawback in connection with the BPF 330. Specifically, the BPF 330 cascaded between the frequency mixer 320 and the frequency doubler 250 is generally disposed outside the chip of the IC. The input frequency of the frequency doubler 250 is equal to the frequency of the output carrier signal delivered through the transmission antenna as shown in FIG. 5. Thus, the carrier signal is fed back through the transmission antenna to the input of the frequency doubler 250 to make the phases of the orthogonal carrier waves unstable, thereby degrading the modulation accuracy.

Those problems of the quadrature modulator of FIG. 3 are more noticeable in the cellular phones which have extremely smaller dimensions.

SUMMARY OF THE INVENTION

In view of the above problems in the conventional techniques, it is an object of the present invention to provide a quadrature modulator having a simplified structure and smaller dimensions, and capable of suppression of the degradation caused by the feed-back of the output carrier signal as encountered in the conventional quadrature modulators.

The present invention provides a quadrature modulator including a local oscillator for oscillating at an oscillation frequency equal to 4/(2N+1) times a carrier frequency where N is a natural number, a frequency conversion block for multiplying the oscillation frequency by a factor of (2N+1)/2, a first frequency divider to divide an output from the frequency conversion block by a factor of two to output a pair of carrier waves having therebetween a phase difference of 90 degrees, first and second multipliers for modulating the carrier waves with a digital baseband signal to output a pair of modulated signals, and an adder for adding the modulated signals together to output a digital carrier signal having the carrier frequency.

In accordance with the present invention, the structure of the quadrature modulator is simplified and the feed-back of the output carrier signal does not affect the modulation accuracy, thereby generating a carrier signal having an accurate carrier frequency substantially without generating interference waves against the adjacent frequency band.

In the present invention where "N" is equal to "1", the frequency conversion block preferably includes a second frequency divider for dividing the oscillation frequency by a factor of two to generate a divided frequency, a frequency mixer for mixing outputs from the local oscillator and the frequency to generate a first signal having a frequency equal to a sum of the oscillation frequency and the divided frequency.

In the present invention where N is equal to or more than "2", the frequency conversion block preferably includes a second frequency divider for dividing the oscillation frequency by a factor of two to output another divided frequency, N frequency mixers cascaded from one another for mixing the oscillation frequency and the divided frequency or an output from a preceding one of the frequency mixers to output a first signal having a frequency equal to a sum of the oscillation frequency and the divided frequency or a frequency of another first signal output from the preceding one of the frequency mixers.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals.

Figure 6:
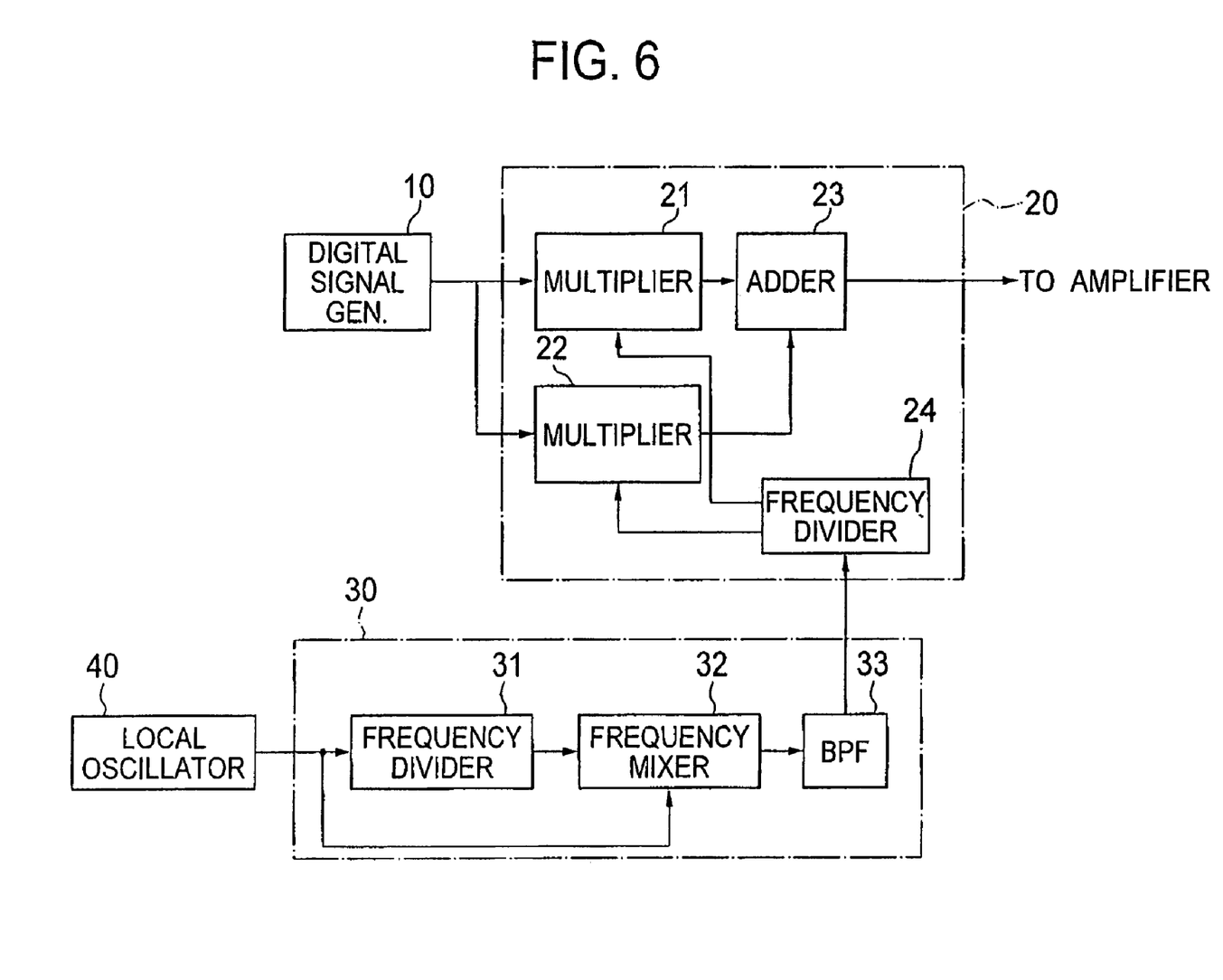
FIG. 6 is a block diagram of a quadrature modulator according to a first embodiment of the present invention.

Referring to FIG. 6, a quadrature modulator according to a first embodiment of the present invention is an example wherein the natural number N defined in the present invention is selected at "1". The quadrature modulator of the present embodiment includes a quadrature modulation block 20 and a frequency conversion block 30, and operates based on an output frequency generated by a local oscillator 40 to modulate orthogonal carrier waves with a baseband signal output from a digital signal generator 10 and deliver an output digital carrier signal. The local oscillator 40 oscillates at an oscillation frequency $f_{osc}$ equal to ⅔ of the frequency (carrier frequency) of the output carrier signal. The frequency conversion block 30 multiplies the oscillation frequency $f_{osc}$ into 3/2 thereof.

The quadrature modulation block 20 includes a first frequency divider (½-frequency-divider) 24 for dividing the output frequency of the frequency conversion block 30 by a factor of two to deliver orthogonal carrier waves, first and second multipliers 21 and 22 for modulating the orthogonal carrier waves with the baseband signal from the digital signal generator 10, and an adder 23 for adding the outputs from the first and second multipliers 21 and 22 to output the digital carrier signal.

The frequency conversion block 30 includes a second frequency divider (½-frequency-divider) 31 for dividing the oscillation frequency $f_{osc}$ by a factor of two, a frequency mixer 32 for operating for frequency conversion based on the outputs from the second frequency divider 31 and the local oscillator 40 to generate a frequency component equal to the sum of the output frequency $f_{osc}/2$ of the frequency divider 31 and the output frequency $f_{osc}$ of the local oscillator 40 as well as an image signal component, and a BPF 33 for removing the image signal component from the output from the frequency mixer 32 to pass the carrier frequency component.

In operation, the output frequency $f_{osc}$ of the local oscillator 40 is divided by the second frequency divider 31 into $f_{osc}/2$. The frequency mixer 32 operates for signal conversion based on the output frequency $f_{osc}/2$ of the frequency divider 31 and the output frequency $f_{osc}$ of the local oscillator 40. The frequency mixer 32 is implemented by a known double-balanced mixer such as shown in FIG. 4.

Assuming that the output waveforms from the local oscillator and the first ½-frequency-divider 31 are expressed by:

$$V_H \sin \omega_{osc} t \text{ and } V_L \sin(\omega_{osc} t/2),$$

respectively (where $\omega_{osc} = 2\pi f_{osc}$), the output $LO_1(t)$ of the frequency mixer 32 is expressed as follows:

$$LO_1(t) = V_H \sin\omega_{osc} t \times V_L \sin(\omega_{osc} t/2)$$
$$= -(1/2) \cdot V_L V_H \cos(\omega_{osc} + \omega_{osc}/2)t +$$
$$(1/2) \cdot V_L V_H \cos(\omega_{osc} - \omega_{osc}/2)t$$

-continued
$$= -(V_L V_H/2) \cdot \cos(3\omega_{osc} t/2) +$$
$$(V_L V_H/2) \cdot \cos(\omega_{osc} t/2),$$

wherein the gain of the double-balanced mixer is assumed at "1" for the purpose of simplification That is, the output from the frequency mixer 32 includes the angular frequency components of $3\omega_{osc}/2$ and $\omega_{osc}/2$, the latter being the image signal component.

Assuming that the frequency of the output digital carrier signal is 930 MHz, as in the case of the conventional quadrature modulator, the local oscillator 40 outputs an oscillation frequency of 1240 MHz to the second frequency divider 31.

The output frequency 620 MHz from the second frequency divider 31 and the output frequency 1240 MHz from the local oscillator 40 generates frequency components of 1860 MHz and 620 MHz in the output from the frequency mixer 32. Thus, the difference in the frequency between the carrier wave and the image signal is 1240 MHz in the output from the frequency mixer 32. The BPF 33 removes the image signal component of 620 MHz to pass the signal component of 1860 MHZ, which is double the frequency of the carrier wave. The first frequency divider 24 divides the input thereof by a factor of two to output orthogonal carrier waves having a frequency of 930 MHz.

The first frequency divider 24 includes a D-type flip-flop acting as a 90° phase shifter. The D-type flip-flop is widely used as the 90° phase shifter because it delivers a master output signal and a slave output signal having therebetween an accurate phase difference of 90 degrees, provided that the clock signal and the inverted clock signal received in the D-type flip-flop have a duty ratio equal to 50%. Due to this characteristic of the D-type flip-flop, accurate orthogonal carrier waves are obtained as the output of the first ½-frequency-divider 24.

The first and second multipliers 21 and 22 modulate the orthogonal carrier waves with the baseband signal output from the digital signal generator 10. The adder 23 adds both the outputs from the first and second multipliers 21 and 22 to deliver the output digital carrier signal.

Figure 7:
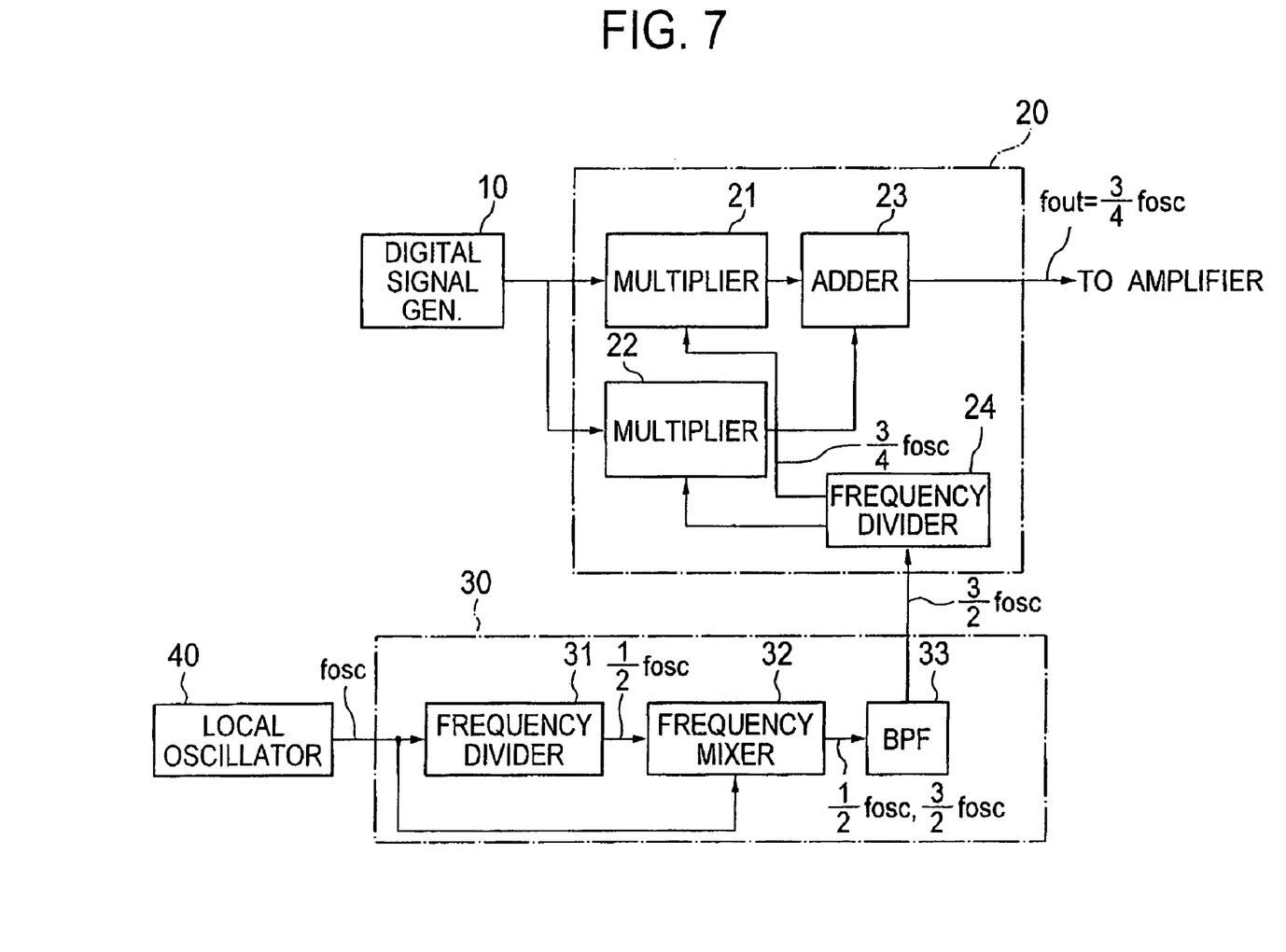
FIG. 7 is a block diagram for illustrating the frequency of the output of each component shown in FIG. 6.

Referring to FIG. 7, there is shown frequency of the output of each constituent elements in the quadrature modulator of FIG. 6. The output frequency $f_{osc}$ from the local oscillator 40 is divided by the frequency divider 31 by a factor of two. The frequency mixer 32 generates an output signal having frequency components of $f_{osc}/2$ and $3f_{osc}/2$ by addition and subtraction of the input frequencies. The frequency component $3f_{osc}/2$ is passed through the BPF 33 and divided by the first frequency divider into $3f_{osc}/4$. Thus, orthogonal carrier waves having a frequency of $3f_{osc}/4$ are obtained. The carrier frequency ($3f_{osc}/4$) which is different from the oscillation frequency ($f_{osc}$) does not affect the oscillation frequency in the case of feedback of the output digital carrier signal.

The non-linearity of the frequency mixer 32 may generate spurious signals by frequency conversion of a plurality of harmonics of the oscillation frequency and the frequency divided therefrom into ½. However, the spurious signal among these spurious signals re-siding in the vicinity of the carrier frequency has a frequency equal to the carrier frequency. Thus, signal interference does not occur between the spurious signals and the carrier signal, whereby the feedback of the output carrier signal through the transmission antenna does not degrade the modulation accuracy.

In addition, two ½-frequency-dividers 24 and 31 are sufficient for the quadrature modulator. Further, since the output frequency from the frequency conversion block 30 is double the frequency of the output digital carrier signal, an additional frequency doubler is not needed. This fact also obviates provision of the d.c.-blocking capacitor. Thus, the dimensions of the IC pellet can be reduced.

Figure 8:
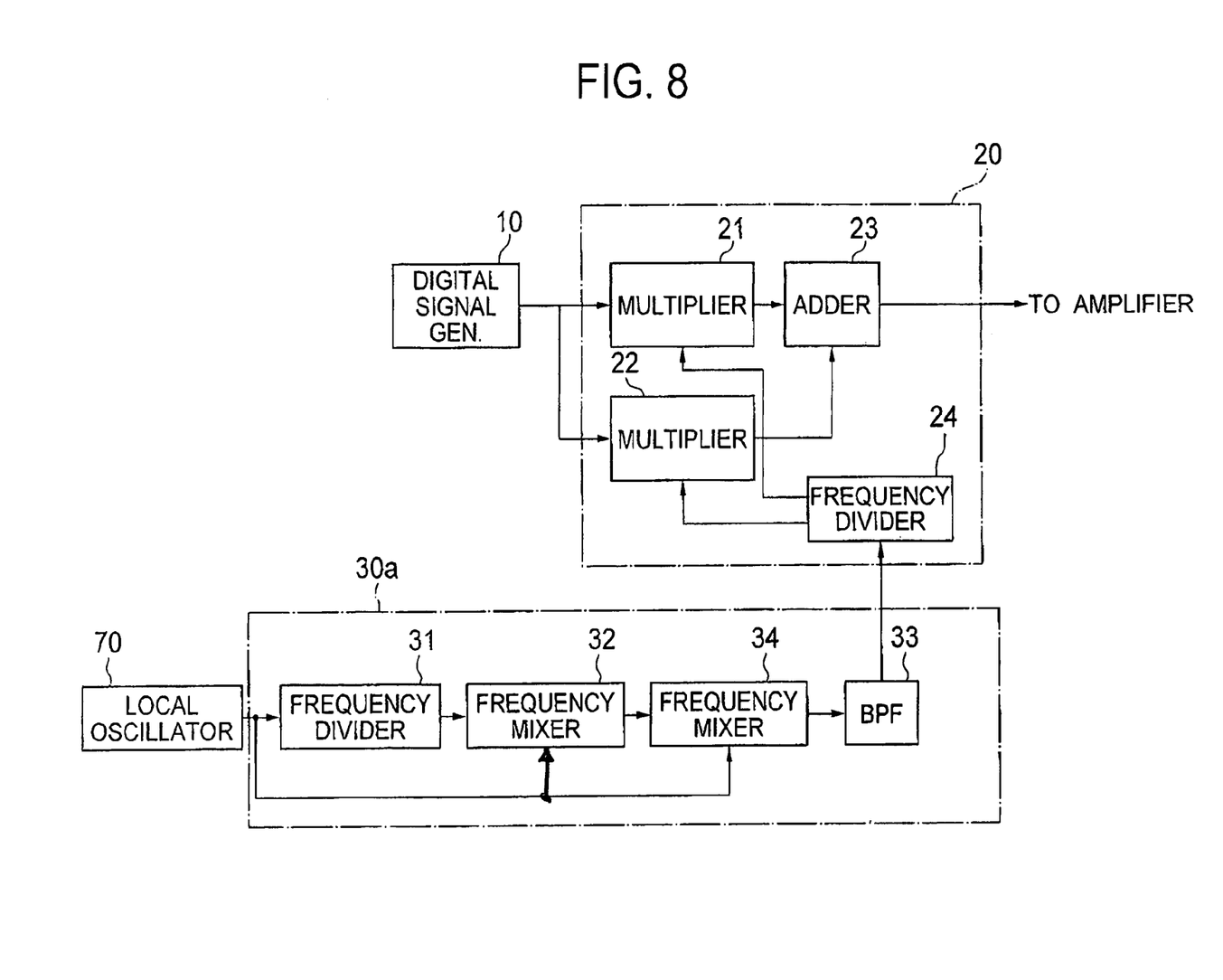
FIG. 8 is a block diagram of a quadrature modulator according to a second embodiment of the present invention.

Referring to FIG. 8, a quadrature modulator according to a second embodiment of the present invention is similar to the first embodiment except for the natural number N in the present embodiment, which is selected at "2", and an additional (second) frequency mixer 34 provided in the frequency conversion block 30a of the present embodiment.

In the present embodiment, the local oscillator 70 oscillates at an oscillation frequency of ⅘ of the output digital carrier signal, and the frequency conversion block 30a multiplies the oscillation frequency by 5/2.

The frequency conversion block 30a includes a second ½-frequency-divider 31, a first frequency mixer 32 for receiving the outputs from the local oscillator 70 and the second ½-frequency-divider 31, a second frequency mixer 34 for receiving the outputs from the local oscillator 70 and the first frequency mixer 32, and a BPF 33 which are cascaded in this order.

The first frequency mixer 32 outputs a signal having angular frequency components of $3\omega_{osc}/2$ and $\omega_{osc}/2$, as in the case of the first embodiment.

Figure 9:
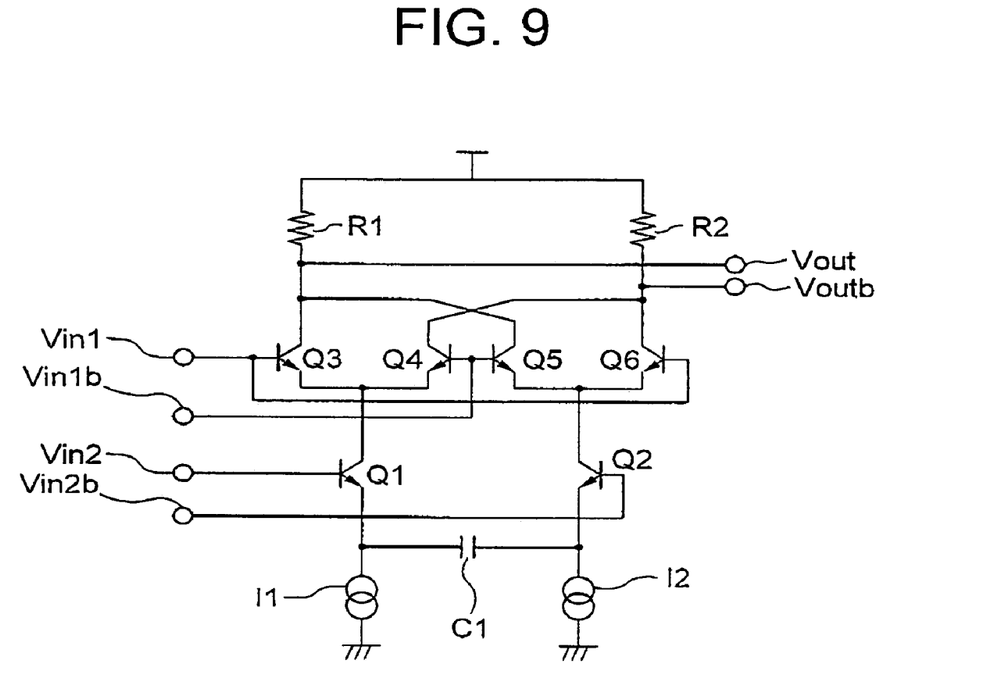
FIG. 9 is a circuit diagram of one of the frequency mixers shown in FIG. 8.

Referring to FIG. 9, the second frequency mixer 34 in FIG. 8 is implemented by a double-balanced mixer. The double-balanced mixer of FIG. 9 includes a first (in input side) differential transistor pair Q1 and Q2 each having an emitter connected to the ground through a current source $I_1$ or $I_2$, a second differential transistor pair Q3 and Q4 having coupled emitters connected to the collector of transistor Q1 of the first differential transistor pair, and a third differential transistor pair Q5 and Q6 having coupled emitters connected to the collector of transistor Q2 of the first differential transistor pair.

The emitters of transistors Q1 and Q2 of the first differential transistor pair are connected together through a capacitor C1. This configuration is similar to the double-balanced mixer of FIG. 4 except for the configuration wherein the emitters of the transistors Q1 and Q2 in FIG. 4 are connected together through a resistor R3. The terminals $V_{in1b}$ and $V_{in2b}$ are grounded via a capacitor, or may be applied with inverted signals of the signals applied through the terminals $V_{in1}$ and $V_{in2}$, respectively.

In the double-balanced mixer of FIG. 9, the first transistor pair Q1 and Q2 assumes a smaller trans-conductance in a lower frequency region, and larger trans-conductance in a higher frequency region. In view is of this fact, it is designed that the output from the first frequency mixer 32 is input to the input terminal $V_{in2}$ for the first differential transistor pair, and the output from the local oscillator 70 is input to the input terminal $V_{in1}$ for the second and third differential transistor pairs. By this configuration, the higher frequency component $3\omega_{osc}/2$ in the output from the first frequency mixer 32 which is obtained by addition of both the input frequencies thereof can be subjected to frequency conversion in the second frequency mixer 34 with a higher gain compared to the lower frequency component $\omega_{osc}/2$ of the output in the first frequency mixer 32.

Assuming that the lower frequency component $\omega_{osc}/2$ of the first frequency mixer 32 is negligible and the outputs from the local oscillator 70 and the first frequency mixer 32 are expressed by:

$$V_H \sin\omega_{osc} t \text{ and } V_L \sin(3\omega_{osc} t/2),$$

respectively, the output $LO_2(t)$ of the second frequency mixer 34 is expressed as follows:

$$\begin{aligned}
LO_2(t) &= V_H \sin\omega_{osc} t \times V_L \sin 3\omega_{osc} t/2 \\
&= -(1/2) \cdot V_L V_H \cos(\omega_{osc} + 3\omega_{osc}/2)t + \\
&\quad (1/2) \cdot V_L V_H \cos(\omega_{osc} - 3\omega_{osc}/2)t \\
&= -(1/2) \cdot V_L V_H \cos(5\omega_{osc} t/2) + \\
&\quad (1/2) \cdot V_L V_H \cos(-\omega_{osc} t/2) \\
&= -(1/2) \cdot V_L V_H \cos(5\omega_{osc} t/2) + \\
&\quad (1/2) \cdot V_L V_H \cos(\omega_{osc} t/2)
\end{aligned}$$

wherein the gain of the double balanced mixer is assumed "1" for the purpose of simplification.

That is, the output from the second frequency mixer 34 includes the angular frequency components of $5\omega_{osc}/2$ and $\omega_{osc}/2$.

The BPF 33 removes the image signal component of $\omega_{osc}/2$ to output a signal component of $5\omega_{osc}/2$, which is double the carrier frequency, to the first frequency divider 24. The operations of the first frequency-divider 24 and the succeeding stages are similar to those in the first embodiment. The frequency of each stage is shown in FIG. 10.

Figure 10:
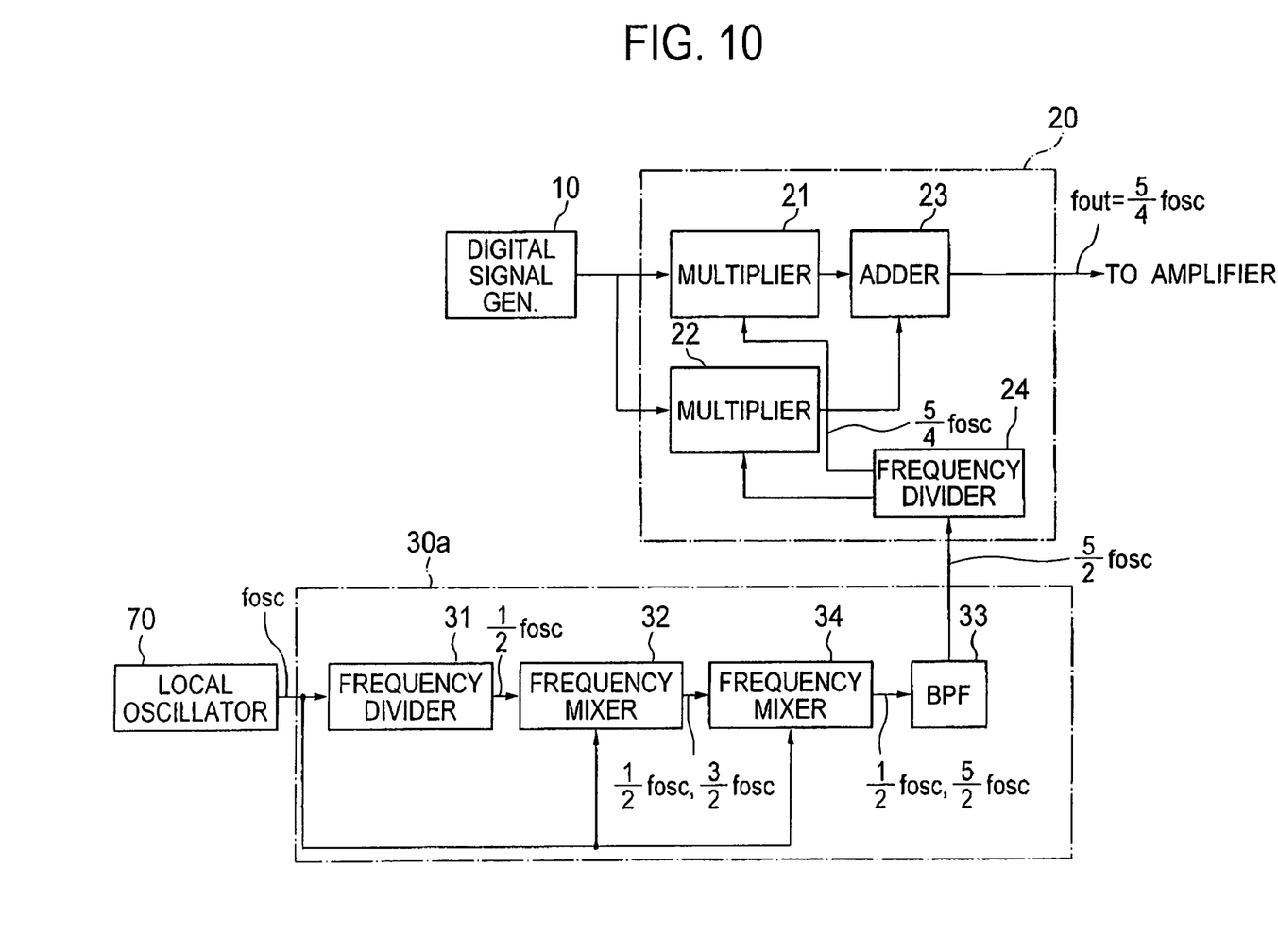
FIG. 10 is a block diagram for illustrating the frequency of the output of each component shown in FIG. 8.

In FIG. 10, the output frequency $f_{osc}$ from the local oscillator 70 is divided by the second frequency divider 31 into $f_{osc}/2$, and the first frequency mixer 32 outputs the summed frequency ($3f_{osc}/2$) and the difference frequency ($f_{osc}/2$) of the input frequencies $f_{osc}$ and $f_{osc}/2$. The second frequency mixer 34 outputs the sum ($5f_{osc}/2$) and difference ($f_{osc}/2$) of the input frequencies $f_{osc}$ and $3f_{osc}/2$. The BPF 33 of the frequency conversion block 30 passes the frequency component $5f_{osc}/2$, which is divided by the first frequency divider 24 into $5f_{osc}/4$. Thus, the carrier frequency is $5f_{osc}/4$ and different from the output frequency $f_{osc}$ of the focal oscillator 70, whereby the feedback of the output digital carrier signal does not degrade the modulation accuracy.

In the second embodiment, as in the case of the first embodiment, the spurious signal among the spurious signals which has a frequency component in the vicinity of the carrier frequency has a frequency equal to the carrier frequency itself. Thus, the spurious signals do not act as interference waves against the oscillation frequency $f_{osc}$.

In addition, the second embodiment has the advantage of smaller dimensions of IC pellet because a d.c.-blocking capacitor is not needed, and there are only two ½-frequency-dividers needed. Further, the feed-back of the output carrier signal through the antenna does not degrade the modulation frequency.

Since the above embodiments are described only for examples, the present invention is not limited to the above embodiments and various modifications or alterations can be easily made therefrom by those skilled in the art without departing from the scope of the present invention.

For example, the quadrature modulator of the present invention can be implemented by a software.

What is claimed is:

1. A quadrature modulator comprising:
   a local oscillator for oscillating at an oscillation frequency;
   a frequency conversion block for converting said oscillation frequency to output a converted oscillation frequency; and
   a quadrature modulation block comprising a frequency divider, a first and second multiplier, and an adder, said frequency divider receiving said converted oscillation frequency and dividing said converted oscillation frequency by a factor of two to output a pair of orthogonal signals having therebetween a phase difference of 90 degrees, said first and second multipliers modulating said pair of orthogonal signals with said baseband signal to output a pair of modulated signals, and said adder adding said modulated signals together to output a carrier signal,
   wherein said carrier signal has a frequency different from said converted oscillation frequency and any signal frequency generated within said frequency conversion block
   wherein the oscillation frequency is equal to $4/(2N+1)$ times the carrier frequency where N is a natural number,
   wherein the frequency conversion block is adapted to multiply said oscillation frequency by a factor of $(2N+1)/2$,
   wherein the first frequency divider divides an output from said frequency conversion block by a factor of two to output a pair of carrier waves having therebetween a phase difference of 90 degrees,
   wherein the first and second multipliers modulate said carrier waves with a digital baseband signal to output a pair of modulated signals, and
   wherein the adder adds said modulated signals together to output a digital carrier signal having said carrier frequency,
   wherein said N is equal to "1", and
   wherein said frequency conversion block includes a second frequency divider for dividing said oscillation frequency by a factor of two to generate a divided frequency, and a frequency mixer for mixing outputs from said local oscillator and said frequency divider to generate a first signal having a frequency equal to a sum of said oscillation frequency and said divided frequency.

2. The quadrature modulator as defined in claim 1, wherein said frequency conversion block further includes a band-pass-filter (BPF) for removing an image signal from said first signal.

3. The quadrature modulator as defined in claim 1, wherein said frequency mixer is a double-balanced mixer.

4. A quadrature modulator comprising a local oscillator for oscillating at an oscillation frequency equal to $4/(2N+1)$ times a carrier frequency where N is a natural number, a frequency conversion block for multiplying said oscillation frequency by a factor of $(2N+1)/2$, a first frequency divider to divide an output from said frequency conversion block by a factor of two to output a pair of carrier waves having therebetween a phase difference of 90 degrees, first and second multipliers for modulating said carrier waves with a digital baseband signal to output a pair of modulated signals, and an adder for adding said modulated signals together to output a digital carrier signal having said carrier frequency, wherein said N is equal to or more than "2", and said frequency conversion block includes a second frequency divider for dividing said oscillation frequency by a factor of two to output a divided frequency, one of N frequency mixers cascaded from one another, which is connected to said second divider, outputs a signal having a frequency equal to a sum of said oscillation frequency and said divided frequency from said second divider, and each of the remaining (N−1) frequency mixers of said N frequency mixers outputs a sum of said oscillation frequency and an output frequency from a preceding frequency mixer of said N cascaded frequency mixers.

5. The quadrature modulator as defined in claim 4, wherein said frequency conversion block further includes a BPF cascaded from an N-th one of said frequency mixers to remove an image signal from said first signal from said N-th one of said frequency mixers.

6. The quadrature modulator as defined in claim 4, wherein each of said frequency mixers is a double-balanced mixer.

7. A quadrature modulator comprising:
   a digital signal generator for generating a digital baseband signal;
   a local oscillator for oscillating at an oscillation frequency equal to $4/(2N+1)$ times a carrier frequency where N is a natural number;
   a frequency conversion block for multiplying said oscillation frequency by a factor of $(2N+1)/2$; and
   a quadrature modulation block including:
   a first frequency divider to divide an output from said frequency conversion block by a factor of two to output a pair of carrier waves having therebetween a phase difference of 90 degrees;
   first and second multipliers for modulating said carrier waves with said digital baseband signal to output a pair of modulated signals; and
   an adder for adding said modulated signals together to output a digital carrier signal having said carrier frequency,
   wherein said frequency conversion block includes a band-pass-filter (BPF) for removing an image signal from said first signal, and
   wherein an output signal from said band-pass-filter (BPF) of said frequency conversion block is supplied directly as an input signal to said first frequency divider of said quadrature modulation block,
   said quadrature modulator not including a frequency multiplier.

8. The quadrature modulator as defined in claim 1, wherein said frequency conversion block includes a frequency divider for dividing said oscillation frequency by a factor of two, a frequency mixer for generating a mixed frequency signal having a frequency equal to a sum of said oscillation frequency and said converted oscillation frequency, and a band-pass filter for removing an image signal component from said mixed frequency signal.

9. A quadrature modulator comprising:
   a local oscillator for oscillating at an oscillation frequency;
   a frequency conversion block for converting said oscillation frequency to output a converted oscillation frequency; and
   a quadrature modulation block for receiving a baseband signal and said converted oscillation frequency, said quadrature modulation block including a first frequency divider for dividing said converted oscillation frequency by a factor of two to output a pair of orthogonal signals having therebetween a phase difference of 90 degrees, first and second multipliers for modulating said pair of orthogonal signals with said baseband signal to output a pair of modulated signals, and an adder for adding said modulated signals together to output a carrier signal.

wherein said carrier signal has a frequency different from said converted oscillation frequency; and wherein said frequency conversion block includes a frequency divider for dividing said oscillation frequency by a factor of two, a first frequency mixer for generating a first mixed frequency signal having a frequency equal to a sum of said oscillation frequency and said converted oscillation frequency, a second frequency mixer for generating a second mixed frequency signal having a frequency equal to a sum of said oscillation frequency and said first mixed frequency signal to output a second mixed frequency signal, and a band-pass-filter for removing an image signal component from said second mixed frequency signal.

10. A quadrature modulator comprising:

a local oscillator for oscillating at an oscillation frequency;

a frequency conversion block for converting said oscillation frequency to output a converted oscillation frequency; and a quadrature modulation block for receiving a baseband signal and said converted oscillation frequency, said quadrature modulation block including a first frequency divider for dividing said converted oscillation frequency by a factor of two to output a pair of orthogonal signals having therebetween a phase difference of 90 degrees, first and second multipliers for modulating said pair of orthogonal signals with said baseband signal to output a pair of modulated signals, and an adder for adding said modulated signals together to output a carrier signal, wherein:

said carrier signal has a frequency different from said converted oscillation frequency, the oscillation frequency is equal to $4/(2N+1)$ times a carrier frequency where N is a natural number, the frequency conversion block multiples said oscillation frequency by a factor of $(2N+1)/2$, the first frequency divides an output from said frequency conversion block by a factor of two to output a pair of carrier waves having therebetween a phase difference of 90 degrees, the first and second multipliers are adapted to modulate said carrier waves with a digital baseband signal, the adder is adapted to add said modulated signals together to output a digital carrier signal having said carrier frequency, and said frequency conversion block includes only one frequency divider for dividing said oscillation frequency by a factor of two to generate a divided frequency.

11. The quadrature modulator as defined in claim 1, wherein said carrier signal has a frequency different from said oscillation frequency.

12. The quadrature modulator as defined in claim 1, wherein the frequency divider of the quadrature modulation block receives the converted oscillation frequency.

* * * * *